United States Patent
Hoentschel et al.

(10) Patent No.: US 9,231,045 B2
(45) Date of Patent: Jan. 5, 2016

(54) METHODS FOR FABRICATING INTEGRATED CIRCUITS WITH POLYCRYSTALLINE SILICON RESISTOR STRUCTURES USING A REPLACMENT GATE PROCESS FLOW, AND THE INTEGRATED CIRCUITS FABRICATED THEREBY

(71) Applicant: GLOBALFOUNDRIES, Inc., Grand Cayman (KY)

(72) Inventors: Jan Hoentschel, Dresden (DE); Stefan Flachowsky, Dresden (DE); Nicolas Sassiat, Dresden (DE); Ralf Richter, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 200 days.

(21) Appl. No.: 13/874,200

(22) Filed: Apr. 30, 2013

(65) Prior Publication Data

US 2014/0319620 A1    Oct. 30, 2014

(51) Int. Cl.
| | |
|---|---|
| *H01L 49/02* | (2006.01) |
| *H01L 27/06* | (2006.01) |
| *H01L 29/66* | (2006.01) |
| *H01L 29/49* | (2006.01) |
| *H01L 29/78* | (2006.01) |

(52) U.S. Cl.
CPC ............ *H01L 28/20* (2013.01); *H01L 27/0629* (2013.01); *H01L 29/4966* (2013.01); *H01L 29/6656* (2013.01); *H01L 29/66545* (2013.01); *H01L 29/66606* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 9,064,931 | B2 * | 6/2015 | Hung | H01L 23/485 1/1 |
| 2008/0169490 | A1 * | 7/2008 | Kawai | H01L 21/84 257/288 |
| 2012/0261643 | A1 * | 10/2012 | Cohen | B82Y 10/00 257/27 |
| 2014/0084383 | A1 * | 3/2014 | Cai | H01L 29/66545 257/401 |

\* cited by examiner

*Primary Examiner* — Hrayr A Sayadian
(74) *Attorney, Agent, or Firm* — Ingrassia Fisher & Lorenz, P.C.

(57) ABSTRACT

Integrated circuits and methods for fabricating integrated circuits are provided. In an embodiment, an integrated circuit includes a first transistor structure that includes an etch-stop material layer, a first workfunction material layer disposed over the etch-stop material layer, a second workfunction material layer disposed over the first workfunction material layer, and a metal fill material disposed over the second workfunction material layer. The integrated circuit further includes a second transistor structure that includes a layer of the etch-stop material, a layer of the second workfunction material disposed over the etch-stop material layer, and a layer of the metal fill material disposed over the second workfunction material layer. Still further, the integrated circuit includes a resistor structure that includes a layer of the etch-stop material, a layer of the metal fill material disposed over the etch-stop material layer, and a silicon material layer disposed over the metal fill material layer.

15 Claims, 14 Drawing Sheets

METHODS FOR FABRICATING INTEGRATED CIRCUITS WITH POLYCRYSTALLINE SILICON RESISTOR STRUCTURES USING A REPLACMENT GATE PROCESS FLOW, AND THE INTEGRATED CIRCUITS FABRICATED THEREBY

TECHNICAL FIELD

The present disclosure generally relates to integrated circuits and methods for fabricating integrated circuits. More particularly, the present disclosure relates to methods for fabricating integrated circuits having polycrystalline silicon ("polysilicon") resistor structures using a replacement gate process flow, and the integrated circuits fabricated thereby.

BACKGROUND

In modern integrated circuits, a very high number of individual circuit elements, such as field effect transistors in the form of CMOS, NMOS, and PMOS elements, are formed on a single chip area. Typically, feature sizes of these circuit elements are decreased with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC). Precise polysilicon resistor has been used in conventional integrated circuit (IC) design. When a semiconductor device such as a metal-oxide-semiconductor field-effect transistor (MOSFET) is scaled down through various technology nodes, a high-k dielectric material and metal are adopted to form a gate stack. For gate replacement processes, the resistance of the formed polysilicon resistors is too low. A single crystalline silicon resistor has been proposed to resolve the issue. However, the single crystalline silicon resistor cannot provide precise impedance matching for the applications, such as analog, radio frequency (RF), and mixed-mode circuits.

For example, in sophisticated applications, resistors may frequently be provided in the form of "integrated polysilicon" resistors, which may be formed above isolation structures so as to obtain the desired resistance value without significantly contributing to parasitic capacitance, as may be the case in "buried" resistive structures which may be formed within the active semiconductor layer. A typical polysilicon resistor may thus require the deposition of the basic polysilicon material, which may frequently be combined with the deposition of a polysilicon gate electrode material for the transistor elements. During the patterning of the gate electrode structures, the resistors are formed, the size of which may significantly depend on the basic specific resistance value of the polysilicon material and the type of dopant material and concentration that may be incorporated into the resistors so as to adjust the resistance values. Since typically the resistance value of doped polysilicon material may be a non-linear function of the dopant concentration, specific implantation processes are required, independent of any other implantation sequences for adjusting the characteristics of the polysilicon material of the gate electrodes of the transistors.

Transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride, may be formed such that it may directly be in contact with gate dielectric material, the presence of a depletion zone may thus be avoided, while, at the same time, a moderately high conductivity is achieved.

As is well known, the threshold voltage of the transistor may depend on the overall transistor configuration, on a complex lateral and vertical dopant profile of the drain and source regions and the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage.

In some of these so-called replacement gate approaches, the high-k dielectric material may be formed in combination with a titanium nitride cap material, which may thus be used as an efficient material for confining the sensitive high-k material and providing a moderately high conductive material layer in close proximity to the gate dielectric material. Thereafter, silicon in an amorphous state is provided so as to act as a placeholder material since the amorphous silicon material may be replaced in a very advanced manufacturing stage. The resulting layer stack in combination with any additional sacrificial materials, such as dielectric cap materials and the like, may then be patterned into a gate electrode structure. Concurrently, the corresponding resistors are formed as described above. Subsequently, any further processes are performed in order to complete the basic transistor configuration by forming drain and source regions, performing anneal processes and finally embedding the transistors and also the resistors in a dielectric material. Consequently, after any high temperature anneal processes, an appropriate material removal sequence may be applied in order to expose the placeholder silicon material, which may then be removed in the gate electrode structures on the basis of highly selective etch processes. Based on an appropriate masking regime, thereafter, appropriate metal-containing electrode materials are filled into the gate electrode structures of N-channel transistors and P-channel transistors in order to adjust the required work function for these different types of transistors. Moreover, a highly conductive electrode metal, such as aluminum and the like, may be filled into the gate electrode structures. In this manner, superior gate conductivity and the desired high degree of channel controllability may be achieved. Furthermore, the work function may be adjusted, for instance, by providing appropriate metal species, wherein any drift in transistor characteristics may be substantially eliminated since any high temperature processes have been performed in the earlier manufacturing phase. In this patterning regime, the resistive structures may also receive the electrode metal, thereby imparting superior conductivity to the resistive structures, which, however, may thus reduce the resistance value, thereby requiring a reduction in line width of the resistors and/or an increase of the total length of the resistors. While the former measure may result in patterning problems since extremely small line widths have to be provided, the latter aspect may result in increased area consumption in the semiconductor die.

For these reasons, it has been proposed to remove the amorphous silicon material selectively from the gate electrode structures and preserving the silicon material in the resistors by appropriate masking regimes and the like. Although the resistance value may be significantly reduced upon preserving the amorphous silicon material, it has nevertheless been recognized that the resulting resistivity may still require significant redesigns of silicon-based resistors when formed in accordance with the above-described replacement gate approaches.

Another way of compensating for the higher resistance polysilicon materials is to replace a polysilicon gate device with a metal gate device. This replacement can be done with a replacement metal gate (RMG) process, wherein the higher temperature processing is performed while the polysilicon is present in the substrate, and after such processing, the polysilicon is removed and replaced with metal to form the replacement metal gate. More specifically, a device with a disposable polysilicon gate is processed, and the disposable gate and dielectrics are etched away, exposing an original gate oxide. The disposable polysilicon gate is then replaced by a metal gate having lower resistivity than the polysilicon material.

In known RMG processes, polysilicon is also removed from the areas forming resistors on the substrate, and replaced with metallic materials. As a result, the high resistive properties of polysilicon are not utilized for resistors on a substrate in which RMG processing has been performed.

Accordingly, it would be desirable to provide an RMG semiconductor fabrication process that is compatible with polysilicon resistor structures. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes the step of providing a semiconductor substrate having formed thereon first, second, and third sacrificial silicon regions, each of the first, second, and third sacrificial silicon regions having sidewall spacer structures formed along sides thereof. The third sacrificial silicon region has a width that is greater than either the first or second sacrificial silicon regions. The method further includes the steps of removing the first, second, and third sacrificial silicon regions to form first, second, and third trench regions between the sidewall spacer structures, depositing an etch-stop layer within the first, second, and third trench regions and over the semiconductor substrate, depositing a first workfunction material layer within the first, second, and third trench regions and over the etch-stop layer, and removing the first workfunction material layer from within the first trench and leaving the first workfunction material layer in the second and third trenches. Still further, the method includes depositing a second workfunction material layer within the first trench and over the etch-stop layer therein, and within the second and third trenches and over the first workfunction material layer therein, removing the first and second workfunction material layers from within the third trench, leaving the first and second workfunction material layers in the second trench, and leaving the second workfunction material layer in the first trench, and depositing a metal fill material layer within the first and second trenches and over the second workfunction material layer therein, and within the third trench over the etch-stop layer therein. The metal fill material layer is of a thickness such that the first and second trenches are completely filled therewith, but the third trench is not completely filled therewith. The method also includes depositing a silicon material layer within the third trench.

In another embodiment, an integrated circuit includes a first transistor structure that includes an etch-stop material layer, a first workfunction material layer disposed over the etch-stop material layer, a second workfunction material layer disposed over the first workfunction material layer, and a metal fill material disposed over the second workfunction material layer. The integrated circuit further includes a second transistor structure that includes a layer of the etch-stop material, a layer of the second workfunction material disposed over the etch-stop material layer, and a layer of the metal fill material disposed over the second workfunction material layer. Still further, the integrated circuit includes a resistor structure that includes a layer of the etch-stop material, a layer of the metal fill material disposed over the etch-stop material layer, and a silicon material layer disposed over the metal fill material layer.

BRIEF DESCRIPTION OF THE DRAWINGS

Embodiments of the present disclosure will hereinafter be described in conjunction with the following drawing figures, wherein like numerals denote like elements, and wherein.

DETAILED DESCRIPTION

The following Detailed Description is merely exemplary in nature and is not intended to limit the integrated circuits or methods for fabricating integrated circuits as claimed herein. Furthermore, there is no intention to be bound by any expressed or implied theory presented in the preceding Technical Field, Background, Brief Summary, or the following Detailed Description.

The present disclosure generally addresses the technical problem of providing semiconductor-based resistors, in particular silicon-based resistors, in the context of a complex manufacturing regime in which high-k metal gate electrode structures are to be provided. To this end, it has been recognized that surprisingly a polycrystalline semiconductor material, and in particular a polycrystalline silicon material hereinafter also referred to as polysilicon, may be used in combination with titanium nitride-based conductive cap layers without requiring a deterioration of the crystalline state of this material, while nevertheless enabling an efficient adjustment of the resistance values of the polysilicon resistors. It has been found that, for otherwise identical device and process parameters, the usage of polysilicon in combination with titanium nitride and in particular in combination with aluminum-containing titanium nitride, which may also be referred to herein as titanium aluminum nitride, may result in resistance values that are approximately 20 percent or even more different compared to the amorphous silicon/titanium nitride combination, thereby indicating that polysilicon is a main contributor to the overall resistance value. Consequently, an efficient adjustment may be accomplished on the basis of the polysilicon material, thereby enabling the provision of the required resistance values of the polysilicon resistors.

Figure 1:
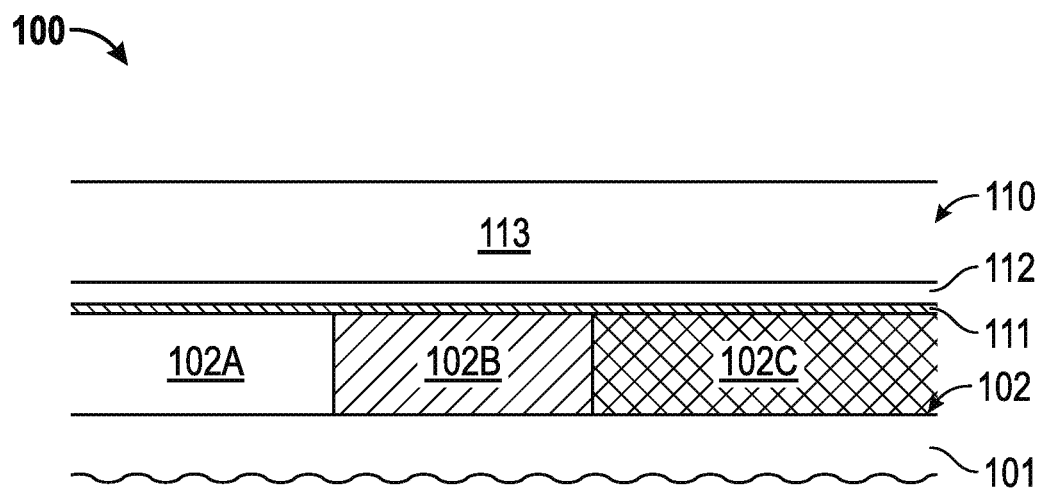
FIGS. 1-12 are partial cross-sectional views of a partially-formed integrated circuit illustrating certain aspects of a method for fabricating an integrated circuit having a silicon resistor structure in accordance with various embodiments of the present disclosure

FIG. 1 schematically illustrates a cross-sectional view of a semiconductor device 100 in an early manufacturing stage. As illustrated, the semiconductor device 100 includes a substrate 101 and a semiconductor layer 102 formed thereon, wherein the substrate 101 and the semiconductor layer 102 may form a "bulk" configuration when the semiconductor layer 102 directly connects to a crystalline material of the substrate 101. In other cases, a silicon-on-insulator (SOI) configuration may be provided by providing a buried insulating layer (not shown) directly below the semiconductor layer 102.

The semiconductor layer 102 may have formed therein a plurality of active regions, i.e., semiconductor regions, in and above which transistors are to be formed. For convenience, two active regions 102A, 102B are illustrated in FIG. 1. Similarly, the layer 102 may include isolation regions, such as an isolation region 102C, which may laterally delineate active regions and which may also provide areas for forming thereon resistive structures and the like. In this case, the isolation region 102C may be considered as a device region above which is to be provided a resistor or resistive structure, as will be described later on. The isolation region 102C may further include an isolation well region 103 (FIG. 2), which is doped with a suitable conductivity-determining dopant.

Moreover, in the manufacturing stage shown in FIG. 1, a stack of material layers 110 is provided above the regions 102A, 102B, and 102C and may include an insulating layer 111 and a conductive metal-containing cap layer 112 in combination with a polycrystalline semiconductor material 113, which in one illustrative embodiment is a polycrystalline silicon material. In other cases, the semiconductor material 113 may also include a certain amount of germanium. The insulating layer 111 may include a high-k dielectric material, such as hafnium oxide, hafnium silicon oxide, zirconium oxide and the like, in order to endow the layer 111 with an increased dielectric constant at an acceptable thickness, which may be about 1.5 nm or greater, thereby keeping any leakage currents at an acceptable level.

The conductive cap material 112 may include titanium and nitrogen, which may also be referred to herein as titanium nitride, while, in other illustrative embodiments, the layer 112 may include, in addition to titanium and nitrogen, also a certain amount of aluminum, for instance one atomic percent or more, so as to form a titanium aluminum nitride material layer. A thickness of the layer 112 may typically be selected in the range of about 5 nm to about 20 nm, depending on the overall device and process requirements.

The polycrystalline material layer 113 may be provided with an appropriate basic doping concentration or may be provided as a substantially non-doped silicon material or silicon/germanium material.

The semiconductor device 100, as illustrated in FIG. 1, may be formed on the basis of the following processes. The active regions 102A, 102B may be defined in lateral size, shape, and position by forming the isolation region 102C, which may be accomplished on the basis of lithography, etch, deposition, and planarization techniques. Prior to or after providing the isolation region 102C, the basic dopant concentration or well doping may be implemented in the active regions 102A, 102B by using well-established implantation processes and masking regimes. Thereafter, the insulating layer 111 may be formed, for instance, by oxidation, when a basic oxide material may be required, by deposition, for instance for providing a silicon dioxide base material using deposition techniques and providing a high-k dielectric material, which may be accomplished on the basis of chemical vapor deposition (CVD), atomic layer deposition (ALD) and the like.

The conductive cap material 112 may be deposited as an electrode material by using well-established sputter deposition techniques and the like. In some illustrative embodiments, the deposition of the layer 112 in the form of a titanium nitride material may involve the incorporation of an aluminum species in order to provide a titanium aluminum nitrogen compound, which may also be referred to as titanium aluminum nitride material. In this case, the titanium contents and the aluminum contents may be at least one atomic percent and more, preferably several atomic percent. A corresponding titanium aluminum nitride material may be provided on the basis of sputter deposition and the like.

Thereafter, to form layer 113, the polycrystalline semiconductor material, such as the silicon material or the silicon/germanium material, may be deposited on the basis of low pressure CVD, thereby forming the material with a polycrystalline state above the layer 112. To this end, any well-established recipes for providing polycrystalline silicon or silicon/germanium material may be used.

Figure 2:
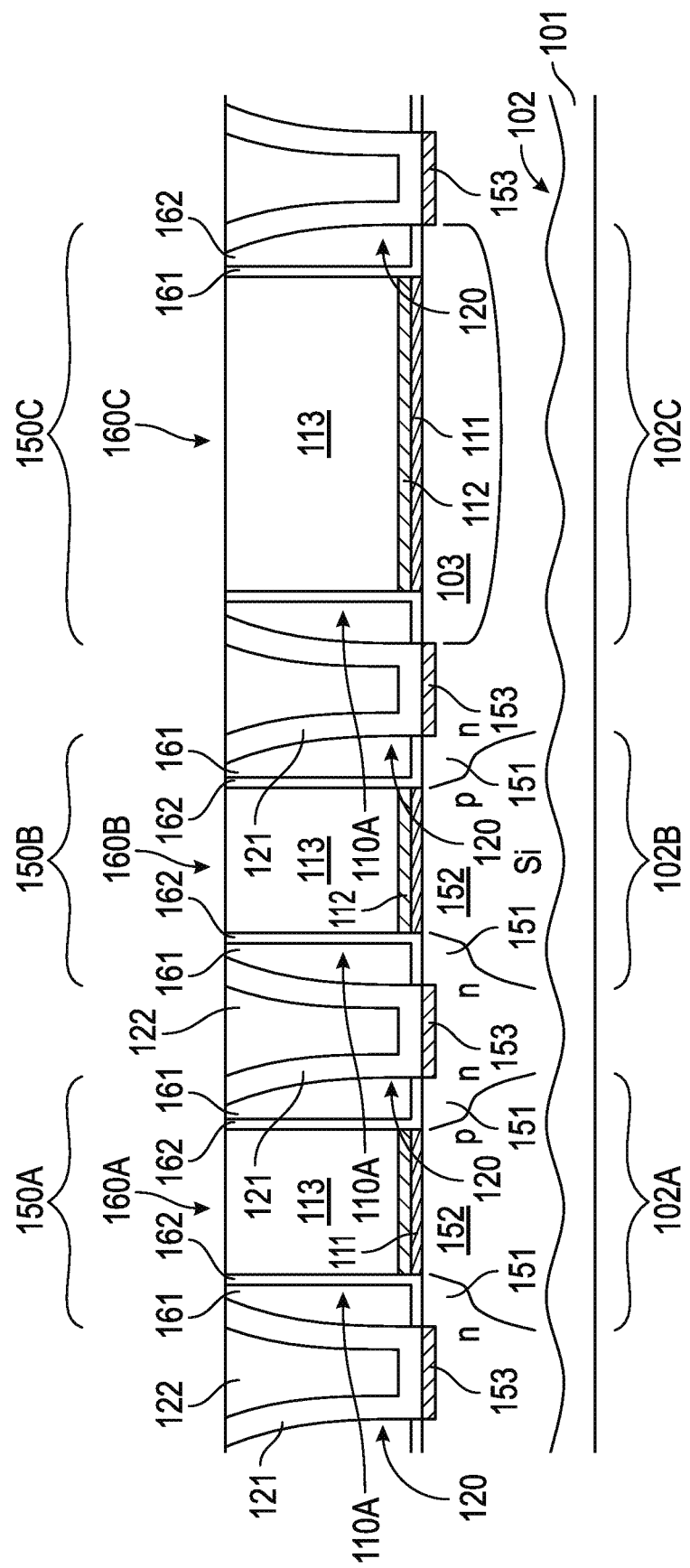

FIG. 2 schematically illustrates the semiconductor device 100 in a further advanced manufacturing stage. As illustrated, gate electrode structures 160A, 160B of transistors 150A, 150B may be formed above the active regions 102A, 102B and may include the material layers 111, 112 and 113. Similarly, a resistor or resistive structure 160C ("resistor") may be formed above the isolation region 102C in resistor region 150C, and may also include the layers 111, 112 and 113. Moreover, the gate electrode structures 160A, 160B and the resistor 160C may include sidewall spacer structures 161, for instance including silicon nitride, silicon dioxide and the like, with a silicon oxide liner 162 formed between the sidewall spacer structures 161 and the gate electrode structures 160A, 160B, and the resistor 160C and the semiconductor layer 102. Optionally, a dielectric cap material (not shown) may be provided on the polycrystalline semiconductor material 113.

The gate electrode structures 160A, 160B and the resistor 160C may be formed on the basis of the layer stack 110 of FIG. 1. That is, the layer stack 110 of FIG. 1 may be patterned on the basis of lithography and etch techniques, thereby providing first and second layer stacks 110A, 110B, which may have appropriate lateral dimensions so as to comply with the requirements of the gate electrode structures 160A, 160B. Similarly, a third layer stack 110C may be provided and may have appropriate lateral dimensions corresponding to the requirements for the resistor 160C. It should be appreciated that the patterning of the layer stack 110 of FIG. 1 may typically involve the deposition of further sacrificial materials, such as the optional dielectric cap layer in combination with other hard mask materials and the like, which may be removed upon forming the gate electrode structures 160A, 160B and the resistor 160C. Since the cap layer is used in some approaches, for instance, for incorporating a strain-inducing semiconductor alloy in some of the active regions of the device 100, this layer may still be preserved in this manufacturing stage. Furthermore, if required, the spacer structures 161 may be provided by using any appropriate process technique, such as multi-layer deposition techniques and the like.

FIG. 2 further illustrates that the transistors 150A, 150B may include drain and source regions 151 formed in the active regions 102A, 102B and laterally enclosing channel regions 152. Furthermore, in the embodiment shown, metal silicide regions 153 may be formed in the drain and source regions 151. The spacer structures 161 may be used for defining the lateral offset of the metal silicide regions 153, if provided in this manufacturing stage, and also to define the lateral and vertical dopant profile of the drain and source regions 151. The spacer structures 161 may have any appropriate configuration in terms of the number of spacer elements, any liners 162, and the like. Next, any appropriate silicidation technique may be applied in order to form the metal silicide material 153.

Furthermore, an interlayer dielectric material or material system 120 may be provided, for instance in the form of a first dielectric layer 121, such as a silicon nitride material, in combination with a second dielectric material 122, such as a silicon dioxide material. The interlayer dielectric material or system 120 may be provided on the basis of any well-established process technique. Thereafter, the further processing may be continued by depositing an appropriate interlayer dielectric material or material system and patterning the same so as to receive openings, which may subsequently be filled with a conductive material in order to form contact elements so as to connect to the transistors 150A, 150B and the resistor 160C. Thereafter, excess material of the material system 120 may be removed, for instance by etching, chemical mechanical polishing (CMP) and the like. In this manner, the polycrystalline material 113 may be exposed, and thereafter an appropriate etch strategy may be applied in order to remove the polycrystalline semiconductor material from the gate electrode structures 160A, 160B, and the resistor 160C, forming a series of openings or "trenches" in place of the removed polycrystalline material 113.

Figure 3:
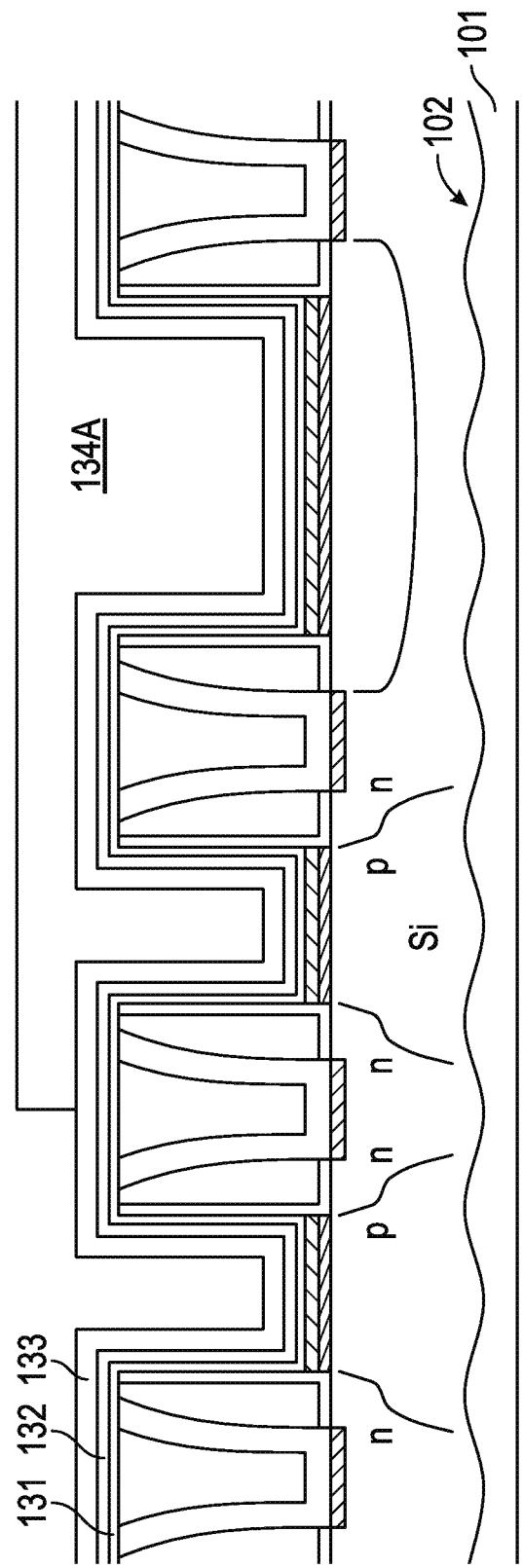

With reference now to FIG. 3, a series of metal layers are deposited over the semiconductor substrate, and a series of masking/etching procedures are performed, to form the replacement metal gate structures within the trenches formed after the removal of the polycrystalline material 113. For example, a first metal layer 131 is deposited that serves as an "etch stop" layer, i.e., a layer that is resistant to subsequent etching procedures. In one example, etch stop layer 131 may be formed of a tantalum nitride (TaN) material. Subsequent to etch stop layer 131, a first workfunction material layer 132 is deposited. In one embodiment, the first workfunction material layer 132 is a p-type metal layer such as a titanium nitride (TiN) material, or other known p-type metal layer, such as tungsten nitride (WN), titanium aluminum (TiAl), or a titanium aluminum nitride (TiAlN). The thickness of the first workfunction material layer 132 is about 50 Å, in one example. Thereafter, a hardmask layer 133, such as a silicon oxide material, is deposited to protect one or more of the structures 160A-C from subsequent etching procedures.

Various types of transistors (i.e., nFET or pFET) can be formed by selectively removing the first workfunction material layer from some of the transistors, and depositing a second workfunction material layer in its place. For example, a patterning process is applied to the semiconductor substrate to cover the regions wherein it is desired for the first workfunction material layer to remain, for example the pFET regions (i.e., transistor 150B). In one example, a patterned photoresist layer 134A is formed on the semiconductor substrate, covering the transistor 150B and the resistor 160C, while leaving the nFET regions open (i.e., transistor 150A). Then, an etching process is applied to the substrate to remove the hardmask layer 133 and the first workfunction material layer 132 from those regions, with the layer 131 serving as an etch stop for this etching process.

Figure 4:
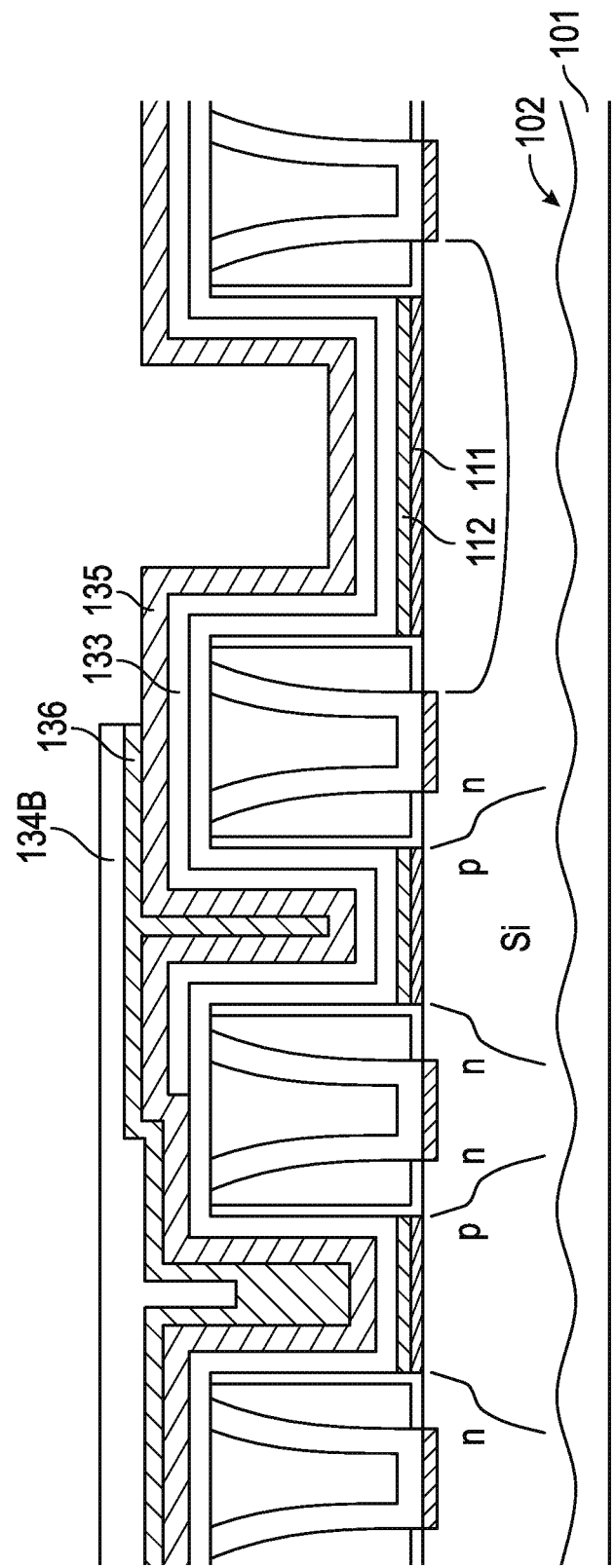

With reference now to FIG. 4, a second workfunction metal layer 135 is deposited over the semiconductor substrate and in the trenches. In one embodiment, the second workfunction material layer 135 is an n-type metal layer such as an aluminum (Al) material, or other known n-type metal layer, such as titanium aluminum (TiAl) layer or a titanium aluminum nitride (TiAlN) layer. The second workfunction metal layer 135 has a thickness of about 10 Å, in one example. Thereafter, a hardmask layer 136, such as a silicon oxide material, is deposited to protect one or more of the structures 160A-C from subsequent etching procedures. For example, a patterning process is applied to the semiconductor substrate to cover the regions wherein it is desired for the workfunction material layers 132, 135 to remain, for example over both transistors 150A and 150B. In one example, a patterned photoresist layer 134B is formed on the semiconductor substrate, covering the transistors 150A and 150B, while leaving open the resistor 160C. Then, an etching process is applied to the substrate to remove the hardmask layer 136 and the workfunction material layers 132, 135 from the resistor 160C, with the layer 131 again serving as an etch stop for this etching process.

Figure 5:
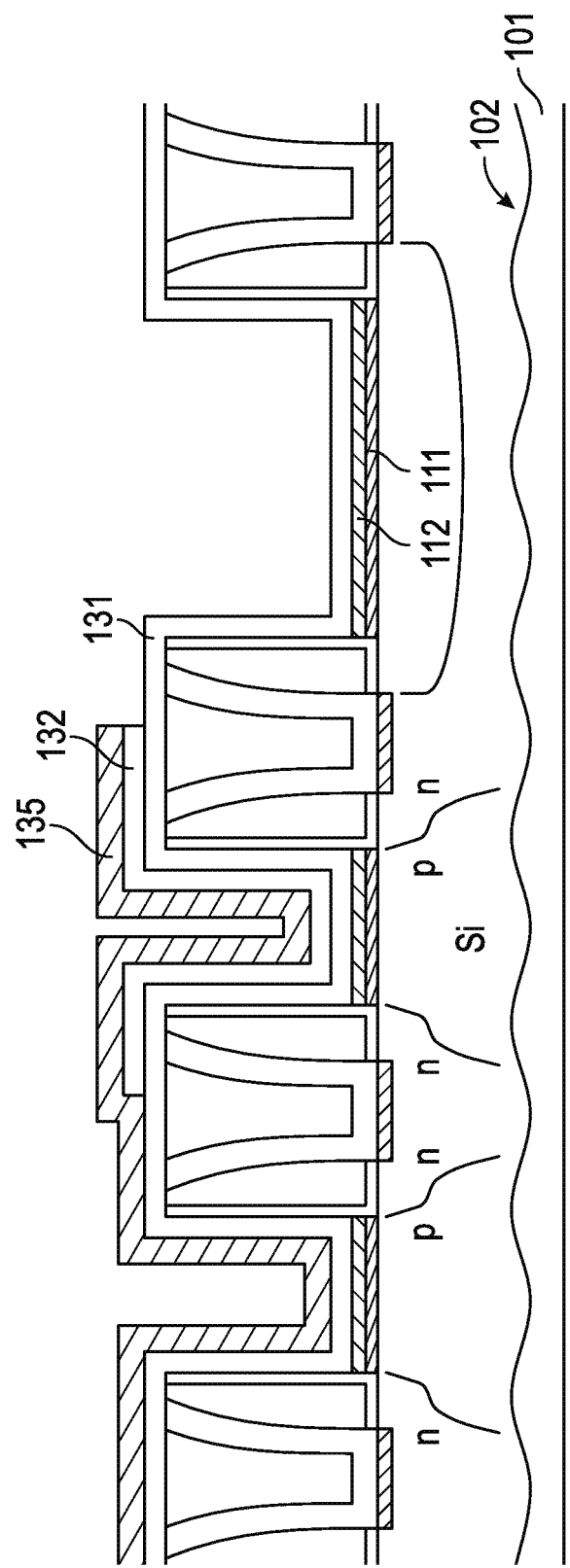

FIG. 5 illustrates the structure formed by the above-described series of metal layer depositing and etching procedures. Transistor 150A is formed with the etch stop layer 131 and the second workfunction material layer 135. Where the second workfunction material layer 135 is of the n-type, transistor 150A is thus formed as an nFET. Transistor 150B is formed with the etch stop layer 131, the first workfunction material layer 132, and the second workfunction material layer 135. In this configuration, the first workfunction material layer 132 determines the conductivity type of the transistor, and as such, where the first workfunction material layer 132 is of the p-type, transistor 150B is formed as a pFET. Resistor 160C, with both workfunction material layers having been removed by the last etching process, is formed only with the etch stop layer 131 at this stage in its fabrication.

Figure 6:
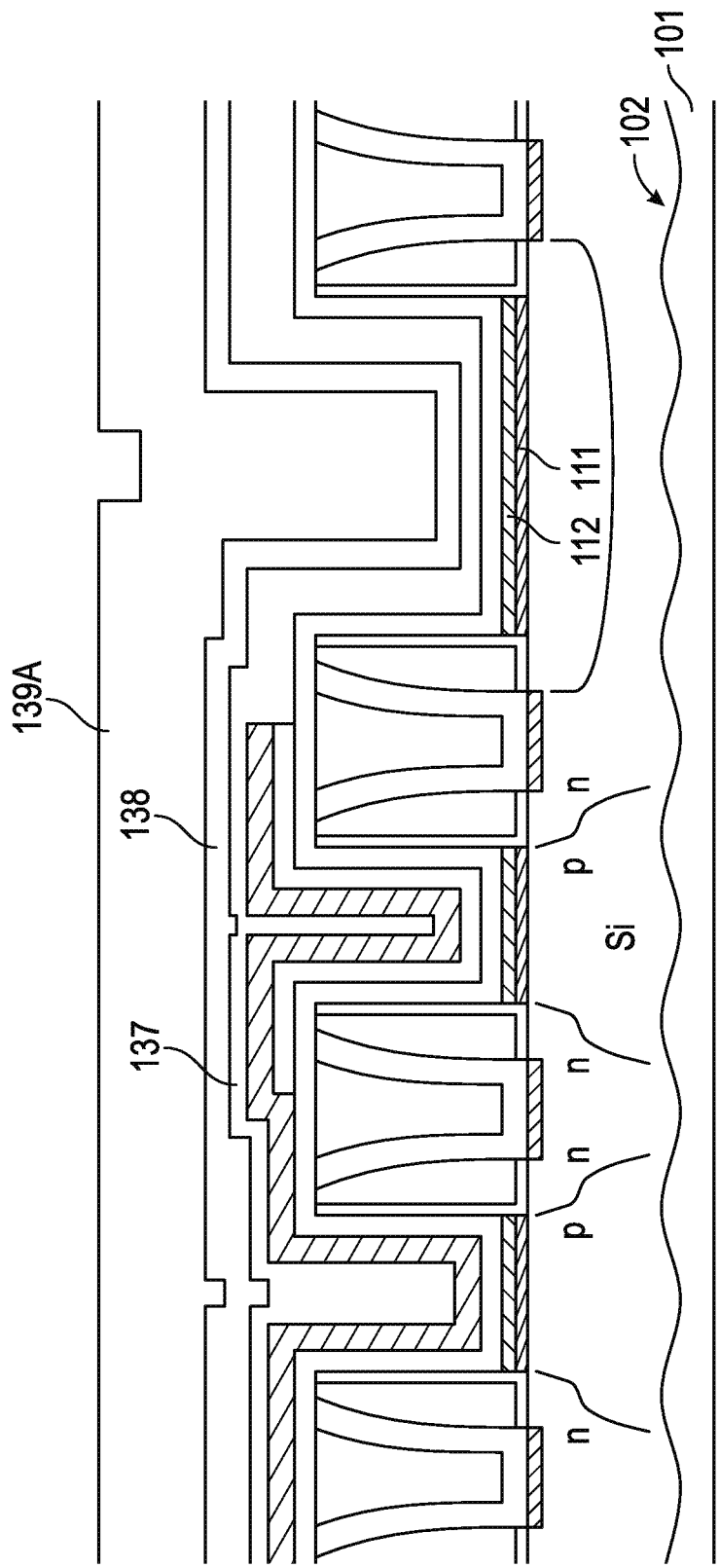
Figure 6B:
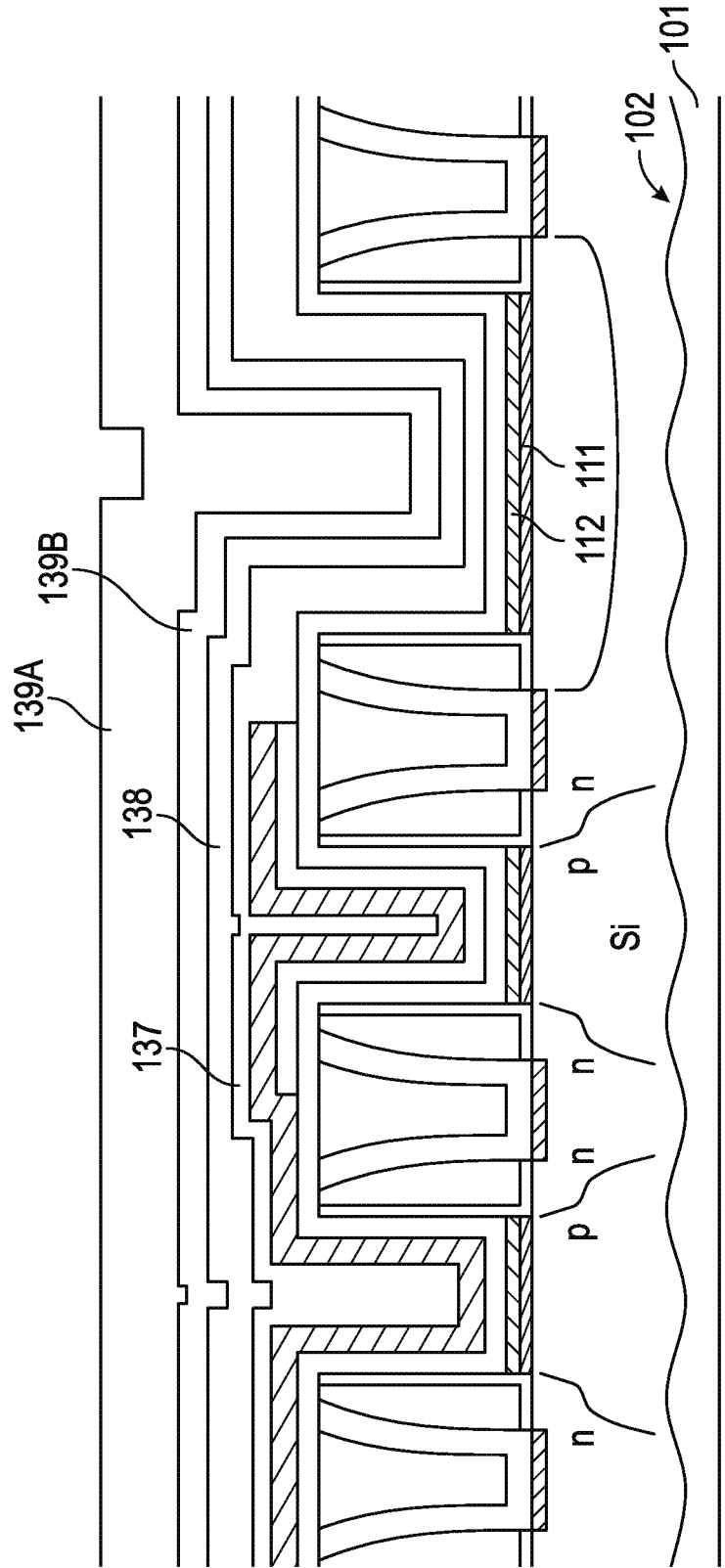

Referring now to FIGS. 6A and 6B, the formation of transistors 150A and 150B is completed with the deposition of a low-resistance metal fill layer 137 over the surface of the semiconductor substrate. In one example, metal fill layer may be an aluminum material, a tungsten material, or other known low-resistance metal. The metal fill layer 137 is deposited to a thickness such that the remaining trenches of transistors 150A, 150B are completely filled. As shown in FIGS. 6A and 6B, the width resistor 160C is greater than the widths of both transistors 150A, 150B, and as such, the thickness sufficient to fill the remaining trenches at transistors 150A, 150B is not sufficient to fill the remaining trench at resistor 160.

One or more resistor fill layers are thus additionally deposited to fill the remaining portion of resistor 160C. The thickness of the fill layers, in addition to the material from which such layers are formed, determines the resistance of the resistor 160C, and as such may be variously selected to provide a wide range of resistances, depending on the application. Prior to the deposition of the one or more resistor fill layers, a metal liner 138 formed of, for example, titanium nitride (TiN) to separate the metal fill layer 137 from the one or more resistor fill layers. As the metal fill layer 137 completely fills transistors 150A, 150B, the metal liner 138 is formed above the transistors 150A, 150B, and thus does not form a part thereof.

In one embodiment, depicted in FIG. 6A, the resistor 160C is filled with a single layer 139A of a silicon material, such as polycrystalline silicon or amorphous silicon. Silicon resistor fill material layer 139A is deposited sufficiently thick so as to completely fill the remaining trench portion at resistor 160C. As with the metal liner 138, the transistor trenches having been previously filled by the metal fill layer 137, the silicon fill material 139A is formed above the transistors 150A, 150B, and thus does not form a part thereof. In another embodiment, depicted in FIG. 6B, the resistor 160C is filled with a dual-layer fill, including a low-resistance fill layer 139B deposited prior to the silicon resistor fill material layer 139A. The low-resistance fill layer 139B can be formed of, for example, a low resistance metal such as aluminum or tungsten (i.e., a material similar to that which was used as transistor fill material layer 137. The additional of the low-resistance fill layer 139B lowers the effective resistance of the resistor 160C shown in FIG. 6B as compared to that shown in FIG. 6A, due to the fact that the silicon resistor fill material layer 139A, which has a high resistance than the low-resistance fill layer 139B, is thinner. By varying the number of resistor fill layers, their resistivities, and their thicknesses, it is thus possible to control tailor the resistance of resistor 160C across a wide range of resistivities.

Figure 7A:
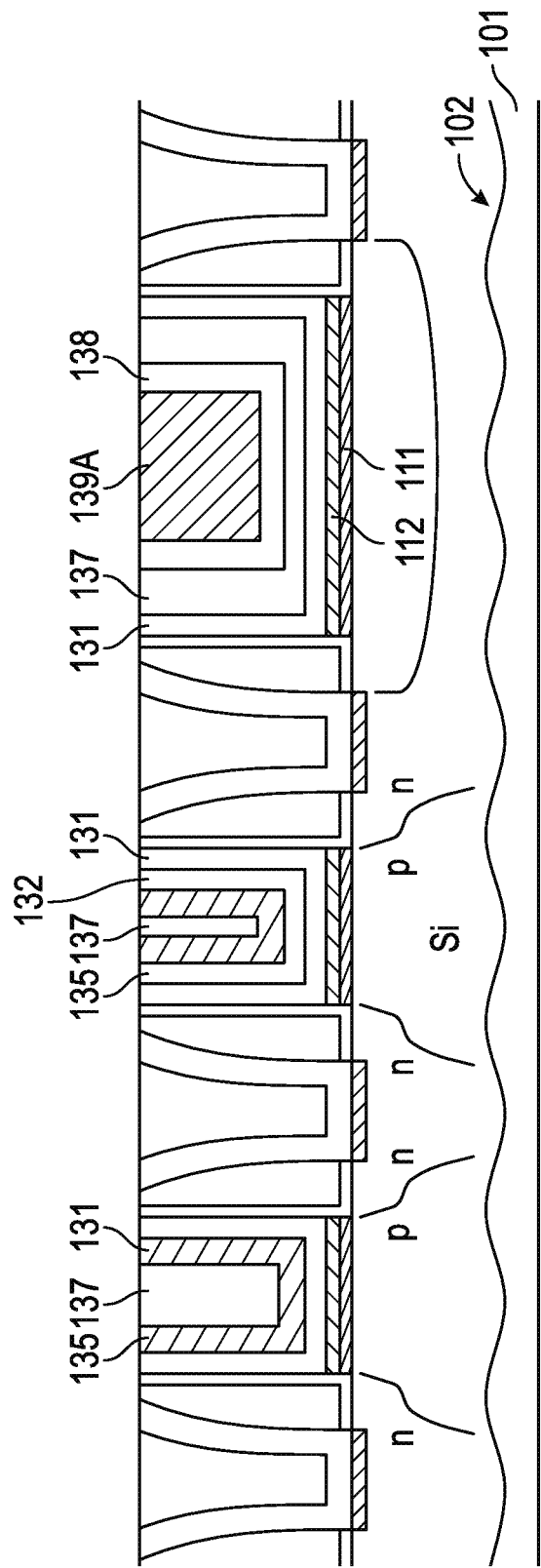
Figure 7B:
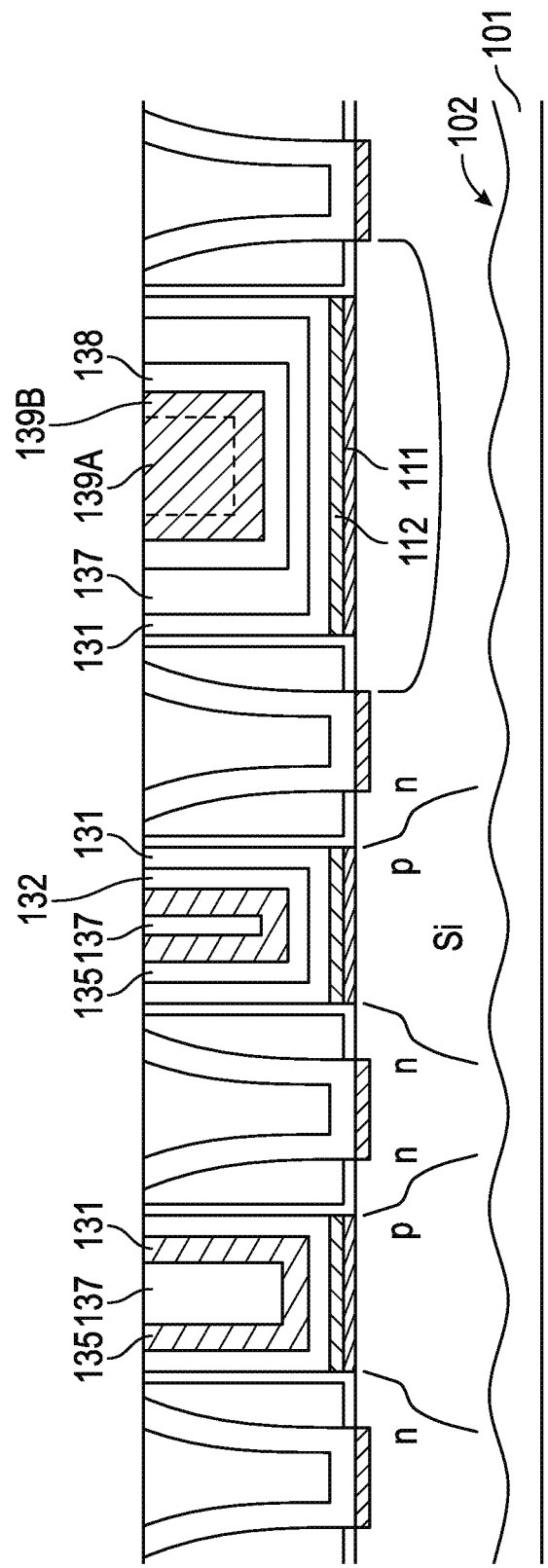

Subsequently, a CMP or other planarizing process is applied to the semiconductor substrate to polish the substrate and substantially remove the excessive fill materials 137, 138, 139A (and/or 139B) above the substrate surface after the deposition processes are completed. FIGS. 7A, 7B illustrate the planarized and polished substrates, including transistors 150A, 150B, and resistor 160C, subsequent to the CMP process.

Figure 8:
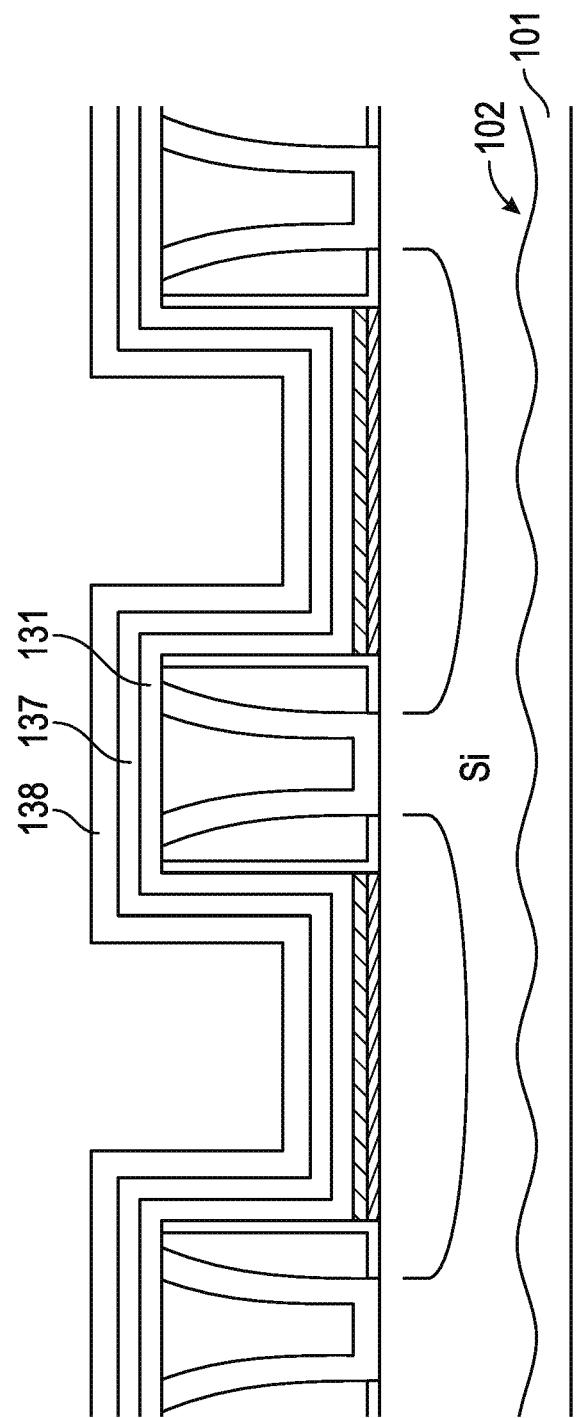
Figure 9:
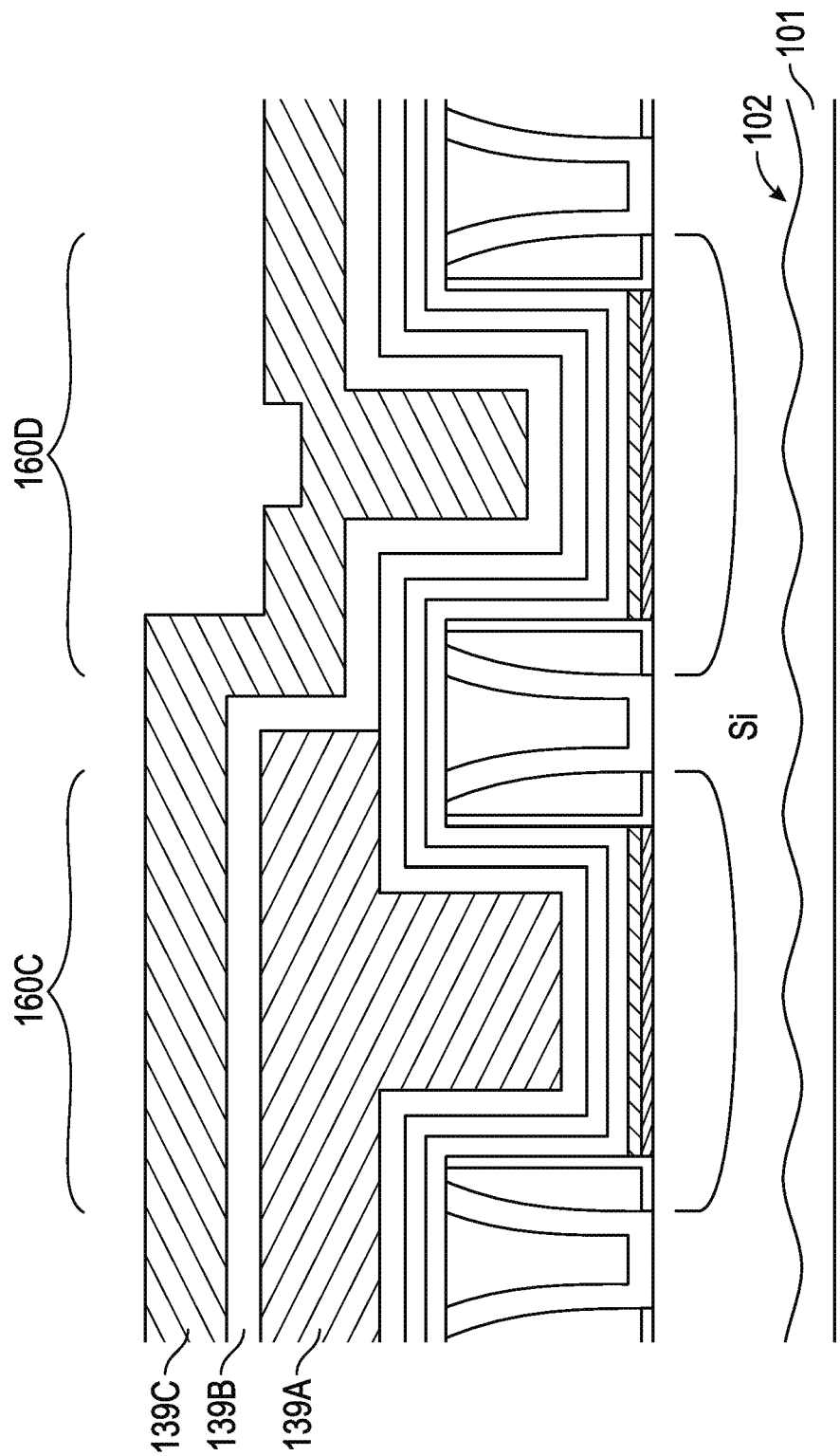
Figure 10:
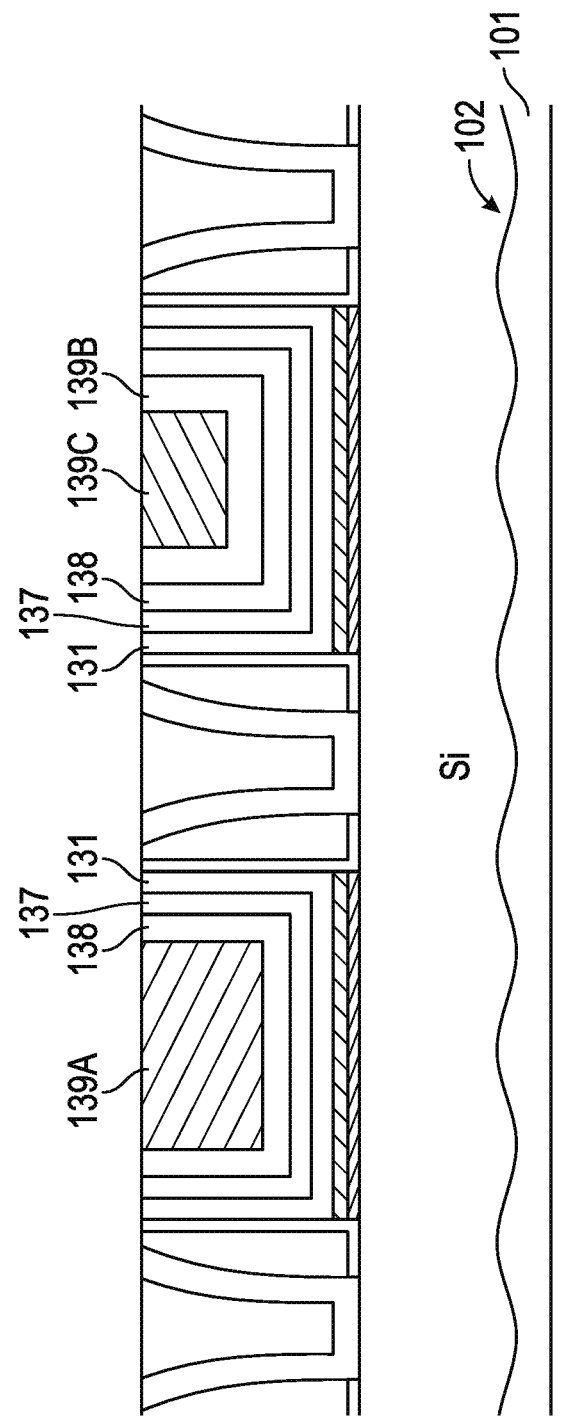

FIGS. 8-10 illustrate an alternative embodiment of the present disclosure, wherein the semiconductor substrate is formed so as to have two or more resistor devices 160C, 160D, each of which having a different resistivity (no transistor structures are shown in FIGS. 8-10 for ease of illustration, however it should be appreciated that any number of transistors may be included, as described in the previous embodiments). With particular attention to FIG. 8, in the same manner as described above with regard to FIG. 6A, a TiN liner 138 is first deposited to provide separation from the metal fill material layer 137. Thereafter, the resistors 160C, 160D are filled with a single layer 139A of a silicon material, such as polycrystalline silicon or amorphous silicon. Silicon resistor fill material layer 139A is deposited sufficiently thick so as to completely fill the remaining trench portion at resistors 160C and 160D. A patterning process is then applied to the semiconductor substrate to cover the regions wherein it is desired for the silicon resistor fill material 139A to remain, for example over resistor 160C. In one example, a patterned photoresist layer 134C is formed on the semiconductor substrate, covering the resistor 160C, while leaving open the resistor 160D. Then, an etching process is applied to the substrate to remove the silicon material layer 139A from the resistor 160D, with the layer 138 serving as an etch stop for this etching process.

With reference now to FIG. 9, subsequent to etching, the resistor 160D is filled with a dual-layer fill, including a low-resistance fill layer 139B deposited prior to a silicon resistor fill material layer 139C, in the same manner as described above with regard to the dual-layer fill shown in FIG. 6B. The low-resistance fill layer 139B can be formed of, for example, a low resistance metal such as aluminum or tungsten. The addition of the low-resistance fill layer 139B is provided to lower the effective resistance of the resistor 160D. Dual layer fill 139B/139C also covers resistor 160C, but as the trench thereof was previously filled by the silicon fill material layer 139A, the dual layer fill 139B/139C is formed over the resistor 160C, and thus does not form any part thereof.

Thereafter, as shown in FIG. 10, a CMP or other planarizing process is applied to the semiconductor substrate to polish the substrate and substantially remove the excessive fill materials 139A, 139B, and 139C above the substrate surface after the deposition processes are completed. By varying the number of resistor fill layers, their resistivities, and their thicknesses with regard to each of resistors 160C and 160D, it is thus possible to include a plurality of resistors having a plurality of different resistivities in the design of the integrated circuit.

Figure 11:
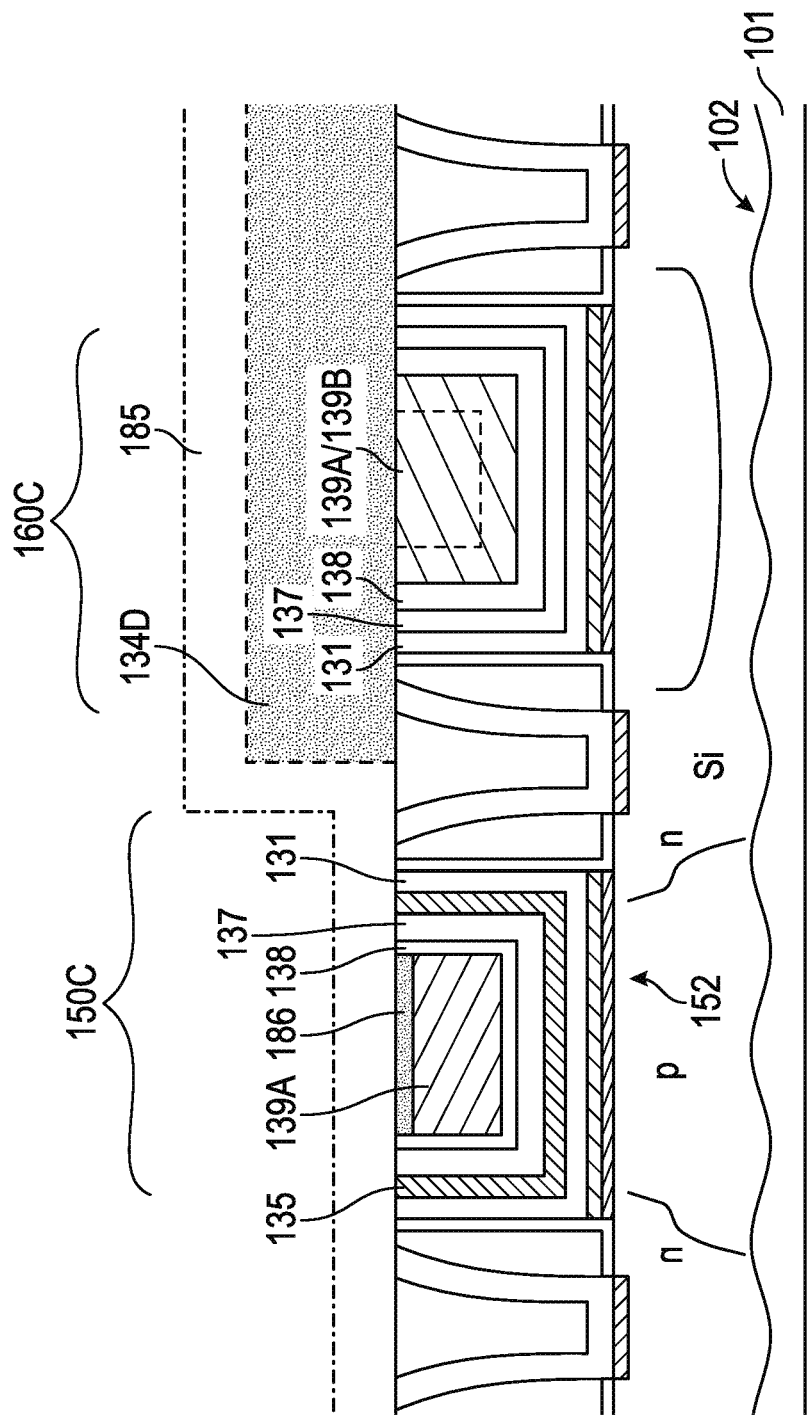
Figure 12:
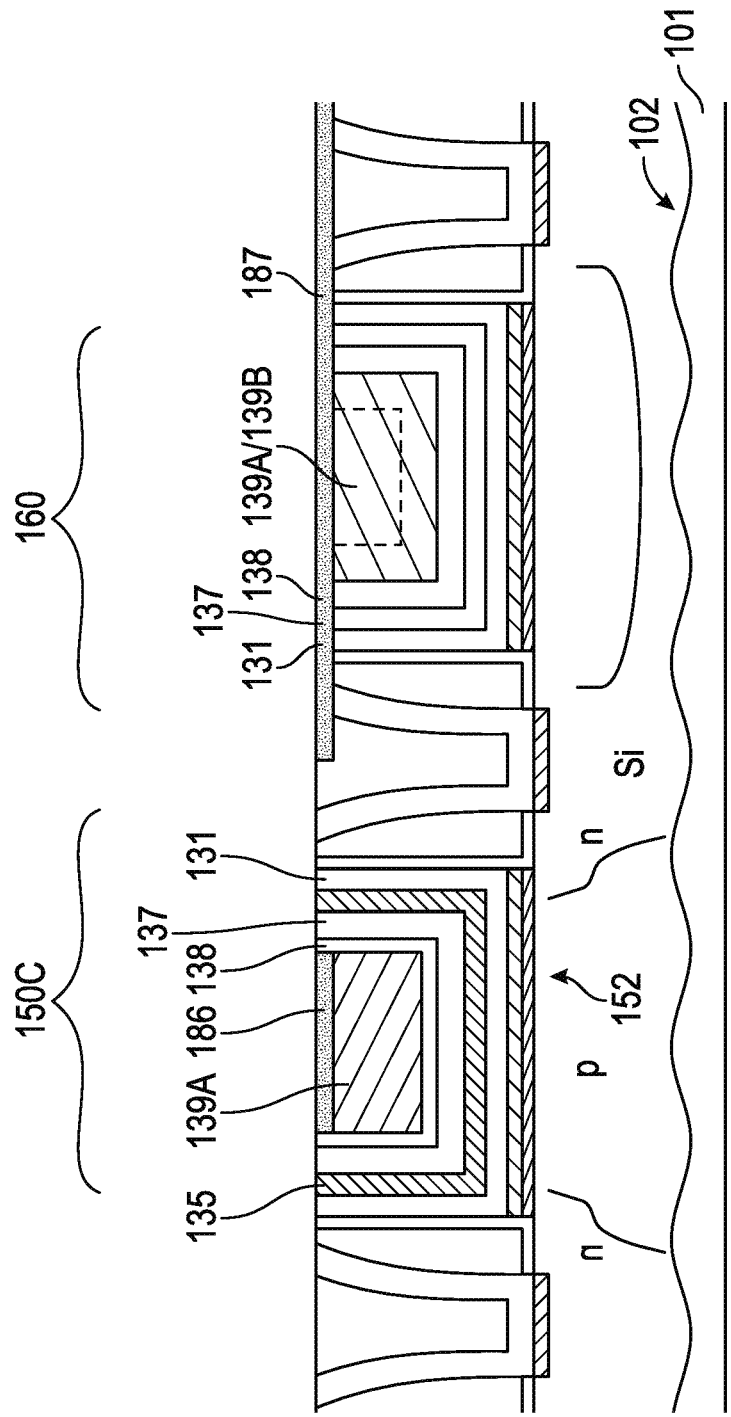

In yet another exemplary embodiment of the present disclosure, depicted in FIGS. 11 and 12 illustrates a process flow wherein one or more of the transistors, i.e., transistor 150C, is a "long-channel" transistor. As known in the art, a long-channel transistor has a width, and thus a channel area 152, that is wider than typical transistors of the integrated circuit. As a result of this additional width, during the deposition of replacement gate fill metal layer 137 as shown in FIGS. 6A and 6B, the layer is not deposited thick enough to completely fill the trench at long-channel transistor 150C. As such, similar to the resistor 160C, which also, as noted above, has a width that is greater than the typical transistor, the trench at long-channel transistor 150C is not completely filled. Thus, during the subsequent deposition of the silicon fill material layer 139A (or the dual-layer fill 139A/139B), the layer 139A fills the remaining portion of the trench at the long-channel transistor 150C. A silicon, whether polycrystalline or amorphous, is a relatively high resistance material, it is necessary to lower the resistance thereof at the transistor 150C to allow the replacement metal gate to function properly, i.e., to have a low resistance.

As shown in FIG. 11, the resistance of the silicon material layer 139A forming part of the gate structure at the long-channel transistor 150C is lowered by the silicidation of such silicon material layer 139A. However, as the high-resistance silicon material is desirable for the resistor 160C a masking layer 134D is first deposited and patterned over the resistor 160C to protect it from silicidation. In one example, a patterned photoresist layer 134D (a silicon oxide or a silicon nitride, for example) is formed on the semiconductor substrate, covering the resistor 160C, while leaving open the long-channel transistor 150C.

Metal silicide region 186 is formed in the silicon material layer 139A over transistor 150C. In a field effect transistor, metal silicide regions are typically formed to reduce the resistance when a conductive contact is formed to establish electrical connection to the silicided region. The metal silicide region 186 depicted in FIG. 11 may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal 185; (2) performing an initial heating process causing the refractory metal to react with underlying silicon containing material; (3) performing an etching process to remove unreacted portions of the layer of refractory metal 185 and (4) performing an additional heating process to form the final phase of the metal silicide (at region 186). The details of such silicidation processes are well known to those skilled in the art. In the illustrative example depicted herein, the metal silicide region 186 may be formed by initially performing a highly-conformal atomic layer deposition (ALD) process or a RF physical vapor deposition (PVD) process to deposit a layer 185 of, for example, cobalt, having a thickness of, for example, about 5 nm to about 15 nm. Thereafter, the anneal-etch-anneal process sequence described above is performed to complete the formation of the metal silicide region 186. In one illustrative embodiment, the metal silicide region 186 may have a thickness of about 10 nm to about 20 nm.

Subsequently, a CMP or other planarizing process is applied to the semiconductor substrate to polish the substrate and substantially remove the hardmask layer 134D above the substrate surface after the silicidation processes are completed. FIG. 12 illustrates the planarized and polished substrate, including an illustration of the region 187 over the resistor 160C that was not exposed to the silicidation process, due to the presence of the hardmask layer 134D.

By the disclosed method, the metal gate stacks for nFETs and pFETs are formed with different compositions and configurations. The work functions for nFET and pFET regions are tuned independently. Further, the resistivity of the resistor is tuned independent of the FETs. Thus, the performances of the nMOSFETs and pMOSFETs are optimized and enhanced. The issues associated with previous resistors employed in replacement metal gate processes are eliminated or reduced.

As a result, the present disclosure provides manufacturing techniques and semiconductor devices in which a polycrystalline semiconductor material in the form of a silicon material, a silicon/germanium material and the like may be used in combination with a "non-modified" conductive cap material, which may be used in the context of forming sophisticated high-k metal gate electrode structures, since it has been recognized that the resulting resistance values of resistors may be dominated by the polycrystalline semiconductor material rather than by the conductive cap material, even if preserved in a non-deteriorated state. Consequently, precise resistance values may be accomplished without requiring a redesign and on the basis of superior process efficiency.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising the steps of:
   providing a semiconductor substrate having formed thereon first, second, and third sacrificial silicon regions, each of the first, second, and third sacrificial silicon regions having sidewall spacer structures formed along sides thereof, wherein the third sacrificial silicon region has a width that is greater than either a width of the first sacrificial silicon region or a width of the second sacrificial silicon region;
   removing the first, second, and third sacrificial silicon regions to form first, second, and third trenches between the sidewall spacer structures of each of the first, second, and third sacrificial silicon regions, respectively;
   depositing an etch-stop layer and a first workfunction material layer within the first, second, and third trenches and over the semiconductor substrate;
   removing the first workfunction material layer from within the first trench to expose the etch-stop layer in the first trench and leaving the first workfunction material layer in the second and third trenches;
   depositing a second workfunction material layer within the first trench and over the etch-stop layer in the first trench, and within the second and third trenches and over the first workfunction material layer in the second and third trenches;
   removing the first and second workfunction material layers from within the third trench to expose the etch-stop layer in the third trench, leaving the first and second workfunction material layers in the second trench, and leaving the second workfunction material layer in the first trench;
   depositing a metal fill material within the first and second trenches and over the second workfunction material layer in the first and second trenches, and within the third trench over the etch-stop layer in the third trench, wherein the metal fill material is deposited to a thickness such that the first and second trenches are completely filled with the metal fill material, but the third trench is not completely filled with the metal fill material; and
   depositing a silicon material layer within the third trench.

2. The method of claim 1, wherein the first, second, and third sacrificial silicon regions comprise a polysilicon material.

3. The method of claim 1, wherein the etch-stop layer comprises a tantalum nitride material.

4. The method of claim 1, wherein the first workfunction material layer comprises an n-type workfunction material.

5. The method of claim 4, wherein the n-type workfunction material comprises an aluminum material.

6. The method of claim 1, wherein the second workfunction material layer comprises a p-type workfunction material.

7. The method of claim 6, wherein the p-type workfunction material comprises a titanium nitride material.

8. The method of claim 1, wherein the metal fill material comprises an aluminum material.

9. The method of claim 1, further comprising depositing a second metal fill material in the third trench prior to depositing the silicon material layer.

10. The method of claim 9, wherein the second metal fill material comprises an aluminum material.

11. The method of claim 9, further comprising depositing a titanium nitride liner prior to depositing the second metal fill material.

12. The method of claim 1, further comprising depositing a titanium nitride liner prior to depositing the silicon material layer.

13. The method of claim 1, wherein the silicon material layer comprises a polysilicon material or an amorphous silicon material.

14. The method of claim 1, wherein the semiconductor substrate further comprises a fourth sacrificial silicon region having sidewall spacer structures formed along sides thereof, wherein the fourth sacrificial silicon region has a width that is greater than either the width of the first sacrificial silicon region or the width of the second sacrificial silicon region, and wherein the method further comprises:

removing the fourth sacrificial silicon region to form a fourth trench between the sidewall spacer structures along the fourth sacrificial silicon region;
depositing the etch-stop layer within the fourth trench and over the semiconductor substrate;
depositing the first workfunction material layer within the fourth trench and over the etch-stop layer;
depositing the second workfunction material layer within the fourth trench and over the first workfunction material layer in the fourth trench;
removing the first and second workfunction material layers from within the fourth trench;
depositing the metal fill material within the fourth trench over the etch-stop layer in the fourth trench, wherein the fourth trench is not completely filled with the metal fill material;
depositing the silicon material layer within the fourth trench;
removing the silicon material from the fourth trench, and leaving the silicon material in the third trench;
depositing a second metal fill material within the fourth trench over the metal fill material; and
depositing a second silicon material layer within the fourth trench.

15. The method of claim 1, wherein the semiconductor substrate further comprises a fourth sacrificial silicon region having sidewall spacer structures formed along sides thereof, wherein the fourth sacrificial silicon region has a width that is greater than either the width of the first sacrificial silicon region or the width of the second sacrificial silicon region, and wherein the method further comprises:
removing the fourth sacrificial silicon region to form a fourth trench between the sidewall spacer structures along the fourth sacrificial silicon region;
depositing the etch-stop layer within the fourth trench and over the semiconductor substrate;
depositing the first workfunction material layer within the fourth trench and over the etch-stop layer;
depositing the second workfunction material layer within the fourth trench and over the first workfunction material layer in the fourth trench;
removing the first and second workfunction material layers from within the fourth trench;
depositing the metal fill material within the fourth trench over the etch-stop layer in the fourth trench, wherein the fourth trench is not completely filled with the metal fill material; and
depositing the silicon material layer within the fourth trench; and
siliciding the silicon material layer in the fourth trench, while not siliciding the silicon material layer in the third trench.

* * * * *